United States Patent
Starreveld et al.

(10) Patent No.: US 10,838,312 B2
(45) Date of Patent: Nov. 17, 2020

(54) LITHOGRAPHIC APPARATUS, LITHOGRAPHIC PROJECTION APPARATUS AND DEVICE MANUFACTURING METHOD

(71) Applicant: ASML NETHERLANDS B.V., Veldhoven (NL)

(72) Inventors: Jeroen Pieter Starreveld, Knegsel (NL); Maurice Willem Jozef Etiënne Wijckmans, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 16/485,681

(22) PCT Filed: Jan. 30, 2018

(86) PCT No.: PCT/EP2018/052258
§ 371 (c)(1),
(2) Date: Aug. 13, 2019

(87) PCT Pub. No.: WO2018/153622
PCT Pub. Date: Aug. 30, 2018

(65) Prior Publication Data
US 2020/0057379 A1 Feb. 20, 2020

(30) Foreign Application Priority Data
Feb. 27, 2017 (EP) .................................... 17158042

(51) Int. Cl.
*G03F 7/20* (2006.01)
(52) U.S. Cl.
CPC .......... *G03F 7/709* (2013.01); *G03F 7/70833* (2013.01); *G03F 7/70991* (2013.01)

(58) Field of Classification Search
CPC ............. G03F 7/70691; G03F 7/70716; G03F 7/70725; G03F 7/70758; G03F 7/70766;
(Continued)

(56) References Cited

U.S. PATENT DOCUMENTS 6,246,204 B1 * 6/2001 Ebihara .................... G03F 7/20
318/566
6,396,562 B1 5/2002 Iwanaga
(Continued)

FOREIGN PATENT DOCUMENTS

WO 2016139012 A1 9/2016

OTHER PUBLICATIONS

Written Opinion and International Search Report directed to related International Patent Application No. PCT/EP2018/052258, dated May 17, 2018; 11 pages.
(Continued)

*Primary Examiner* — Christina A Riddle
(74) *Attorney, Agent, or Firm* — Sterne, Kessler, Goldstein & Fox P.L.L.C.

(57) ABSTRACT

The present invention relates to a lithographic apparatus, comprising: —a primary frame (10) which is provided with a functional unit (11, 12, 14), —a secondary frame (20), —a primary frame support (30), which is adapted to support the primary frame onto the secondary frame, —a flexible utility connection (40), adapted to connect the functional unit to an auxiliary system (51, 52, 53), —a vibration isolation body (60) having a body mass, which is moveably connected to the secondary frame by a flexible passive body support (61) having a body support stiffness, wherein the flexible utility connection is fixed to the vibration isolation body at a distance from the primary frame.

17 Claims, 4 Drawing Sheets

(58) Field of Classification Search
CPC .............. G03F 7/70775; G03F 7/70816; G03F
7/70825; G03F 7/70833; G03F 7/7085;
G03F 7/70858; G03F 7/7086; G03F
7/70883; G03F 7/70908; G03F 7/70991;
G03F 7/709
USPC .............. 355/30, 52–55, 72–77; 250/442.11,
250/492.1, 492.2, 492.21, 492.22, 492.3,
250/493.1, 503.1, 504 R, 505.1; 378/34,
378/35
See application file for complete search history.

(56) References Cited

U.S. PATENT DOCUMENTS

| | | |
|---|---|---|
| 8,743,344 B2 | 6/2014 | Butler et al. |
| 2008/0035372 A1 | 2/2008 | Butler et al. |
| 2009/0153832 A1* | 6/2009 | Tatsuzaki ................ G03F 7/709 |
| | | 355/72 |
| 2009/0201484 A1* | 8/2009 | Arai ........................ B82Y 10/00 |
| | | 355/72 |
| 2014/0185029 A1* | 7/2014 | Kwan ................ G03F 7/70825 |
| | | 355/72 |

OTHER PUBLICATIONS

International Preliminary Report on Patentability directed to related International Patent Application No. PCT/EP2018/052258, dated Aug. 27, 2019; 7 pages.

\* cited by examiner

LITHOGRAPHIC APPARATUS, LITHOGRAPHIC PROJECTION APPARATUS AND DEVICE MANUFACTURING METHOD

CROSS-REFERENCE TO RELATED APPLICATIONS

This application is a 35 U.S.C. 371 National Phase of PCT Application No. PCT/EP2018/052258, filed on Jan. 30, 2018, which claims priority of EP application 17158042.6 which was filed on Feb. 27, 2017, both of which are hereby incorporated by reference herein in their entirety.

BACKGROUND

Field of the Invention

The present invention relates to a lithographic apparatus, a lithographic projection apparatus and a method for manufacturing a device.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In a lithographic apparatus, some parts have to be positioned very accurately in order to obtain the desired quality of the pattern on the substrate, e.g. in terms of focus and position. Such parts are for example the substrate support and optical elements of a projection system which projects the pattered radiation beam onto the substrate. The position of parts of this kind is closely monitored by sensors. Often, these sensors comprise a sensor element which is arranged spaced apart from the part of which the position is to be monitored. The mounting of these sensor elements has to be very stable, because a deviation in the position of the sensor element introduces a measuring error in the monitoring of the position of the part that has to be positioned accurately.

It is known to mount these sensor elements on a separate frame, e.g. a sensor frame or a metrology frame. This separate frame is kept as stable as possible. For example, such a frame may be mounted on a support comprising a vibration isolation system, and/or it may be provided with a cooling system in order to suppress thermal deformation of the frame.

Functional units that are provided on the frame, such as the sensor elements and the cooling system, need however be physically connected to other parts of the lithographic system than the separate frame, e.g. in order to receive electrical power, transmit measurement signals and/or to receive and discharge cooling water. This physical connection is formed by a flexible utility connection which has its own dynamic properties and therewith it has an influence on the dynamic behaviour of the separate frame. For example, it may deteriorate the isolation performance of the support of the separate frame.

It has been found that in particular at higher frequencies, this effect can be significant.

SUMMARY

It is desirable to provide a lithographic system in which the dynamic behaviour of a frame that comprises a functional unit that is connected to a flexible utility connection is improved.

According to an embodiment of the invention, there is provided a lithographic system, which system comprises:
 a primary frame which is provided with a functional unit,
 a secondary frame,
 a primary frame support, which is adapted to support the primary frame onto the secondary frame,
 a flexible utility connection, adapted to connect the functional unit to an auxiliary system,
 a vibration isolation body having a body mass, which is moveably connected to the secondary frame by a flexible passive body support having a body support stiffness,
wherein the flexible utility connection is fixed to the vibration isolation body at a distance from the primary frame.

According to an embodiment of the invention, there is provided a lithographic system, which system comprises:
 a primary frame which is provided with a functional unit,
 a secondary frame,
 a primary frame support, which is adapted to support the primary frame onto the secondary frame,
 a flexible utility connection, adapted to connect the functional unit to an auxiliary system,
 a vibration isolation body having a body mass,
wherein the flexible utility connection is fixed to the vibration isolation body at a distance from the primary frame.

In another embodiment of the invention, there is provided a lithographic apparatus comprising:
 an illumination system configured to condition a radiation beam;
 a support constructed to support a patterning device, the patterning device being capable of imparting the radiation beam with a pattern in its cross-section to form a patterned radiation beam;
 a projection system configured to project a patterned radiation beam onto a substrate; the projection system comprising a plurality of optical elements,
 a primary frame which is provided with a functional unit,
 a secondary frame,
 a primary frame support, which is adapted to support the primary frame onto the secondary frame,
 a flexible utility connection, adapted to connect the functional unit to an auxiliary system,
 a vibration isolation body having a body mass, which is moveably connected to the secondary frame by a flexible passive body support having a body support stiffness, wherein the flexible utility connection is fixed to the vibration isolation body at a distance from the primary frame.

In another embodiment of the invention, there is provided a lithographic projection apparatus arranged to project a pattern from a patterning device onto a substrate, comprising:
- a primary frame which is provided with a functional unit,
- a secondary frame,
- a primary frame support, which is adapted to support the primary frame onto the secondary frame,
- a flexible utility connection, adapted to connect the functional unit to an auxiliary system,
- a vibration isolation body having a body mass, which is moveably connected to the secondary frame by a flexible passive body support having a body support stiffness, wherein the flexible utility connection is fixed to the vibration isolation body at a distance from the primary frame.

In another embodiment of the invention, there is provided a device manufacturing method comprising transferring a pattern from a patterning device onto a substrate, comprising the step of using a lithographic apparatus according to the invention.

In another embodiment of the invention, there is provided a device manufacturing method comprising projecting a patterned radiation beam onto a substrate, comprising the step of using a lithographic apparatus according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
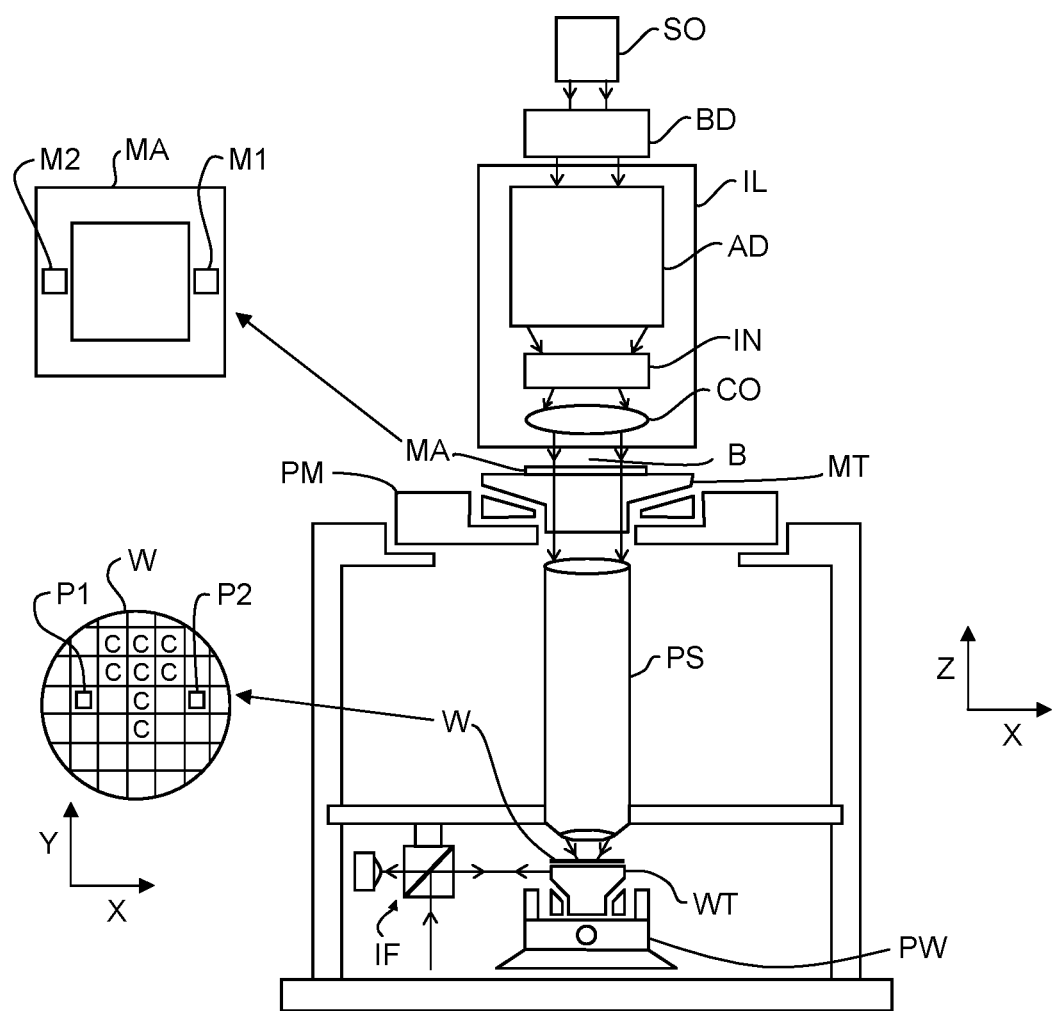
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The mask support structure MT supports, i.e. bears the weight of, the patterning device MA. It holds the patterning device MA in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure MT may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure. In addition to the at least one substrate table WT, the lithographic apparatus may comprise a measurement table, which is arranged to perform measurements but is not arranged to hold a substrate W. The measurement table may be arranged to hold sensor to measure a property of the projection system PS, such as an intensity of the radiation beam B, an aberration of the projection system PS or a uniformity of the radiation beam B. The measurement table may be arranged to hold a cleaning device to clean at least a part of the lithographic apparatus, for example a part near a last lens element of the projection system PS.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device MA and the projection system PS. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The radiation source SO and the lithographic apparatus may be separate entities, for example when the source is an excimer laser. In such cases, the radiation source SO is not considered to form part of the lithographic apparatus and the radiation beam is passed from the radiation source SO to the illuminator IL with the aid of a beam delivery system BD including, for example, suitable directing mirrors and/or a beam expander. In other cases the radiation source SO may be an integral part of the lithographic apparatus, for example when the radiation source SO is a mercury lamp. The radiation source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator IL may be used to condition the radiation beam, to have a desired uniformity and intensity distribution in its cross section.

The radiation beam B is incident on the patterning device MA, which is held on the mask support structure MT, and is patterned by the patterning device. Having traversed the patterning device MA, the radiation beam B passes through the projection system PS, which focuses the radiation beam B onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the mask support structure MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioner PW. In the case of a stepper (as opposed to a scanner) the mask support structure MT may be connected to a short-stroke actuator only, or may be fixed. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C. Such dedicated target portions are known as scribe-lane alignment marks). Similarly, in situations in which more than one die is provided on the patterning device MA, the mask alignment marks M1,M2 may be located between the dies.

The depicted apparatus could be used in at least one of the following modes:

1. In step mode, the mask support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask support structure MT and the substrate table WT or "substrate support" are scanned synchronously while a pattern imparted to the radiation beam is projected onto a target portion C (i.e. a single dynamic exposure). The velocity and direction of the substrate table WT relative to the mask support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion C.

3. In another mode, the mask support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
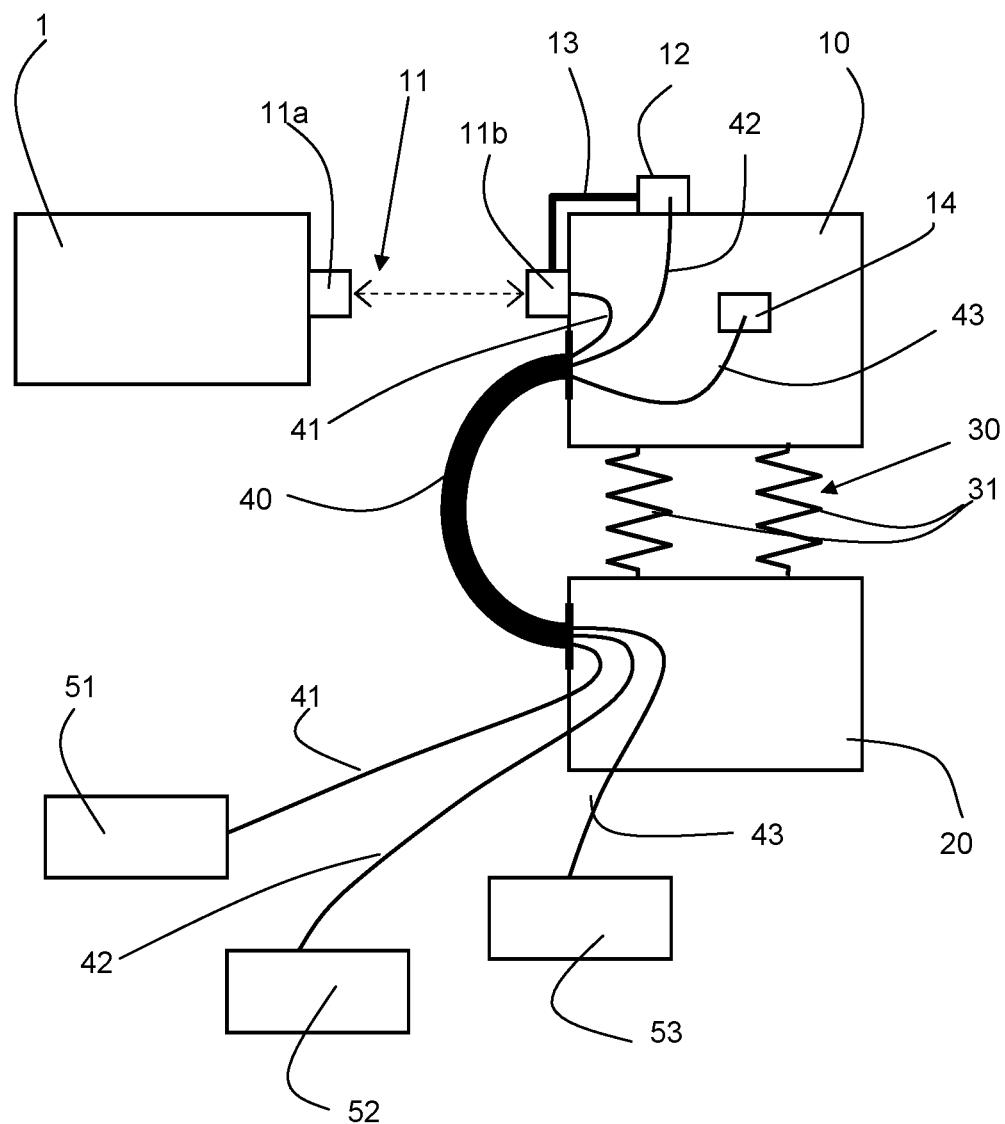
FIG. 2 schematically shows an embodiment of a part of a lithographic apparatus as known from the prior art, FIG. 3 schematically shows a first possible embodiment of the invention, FIG. 4 schematically shows a second possible embodiment of the invention.

FIG. 2 schematically shows an embodiment of a part of a lithographic apparatus as known from the prior art.

In the embodiment of FIG. 2, a primary frame 10 and a secondary frame 20 are provided. Primary frame support 30 supports the primary frame 10 onto the secondary frame 20. In the embodiment of FIG. 2, the primary frame support 30 comprises two vibration isolation systems 31, but alternatively a different number of vibration isolation systems 31 (e.g. three vibration isolation systems 31) is also possible.

In the embodiment of FIG. 2, the primary frame 10 is provided with a plurality of functional units 11, 12, 14.

The first functional unit 11 is a sensor which is configured to measure the position of object 1 relative to the primary frame 10. In the embodiment of FIG. 2, the sensor comprises a first sensor element 11a and a second sensor element 11b. The first sensor element 11a is mounted on the object 1 of which the position is to be monitored, and the second sensor element 11b is mounted onto the primary frame 10.

In the embodiment of FIG. 2, the primary frame 10 is further provided with a second functional unit 12. In this case, the second functional unit 12 is a local power supply unit, which for example provides electrical power to the second sensor element 11b via power supply cable 13. For the sake of clarity, the power supply cable 13 is drawn at a distance from the primary frame 10, but in many cases the power supply cable 13 will be attached to and/or arranged directly onto the surface of the primary frame 10.

In the embodiment of FIG. 2, the primary frame 10 is furthermore provided with a third functional unit 14. In this case, the third functional unit is a cooling device. The cooling device may for example comprise at least one cooling channel which extends through the primary frame 10 through which a cooling medium, e.g. a cooling liquid, can be circulated.

In order to fulfil their function, the functional units 11, 12, 14 have to be connected to respective auxiliary systems 51, 52, 53 which are not arranged on the primary frame 10, but somewhere else in the lithographic system. For example, the sensor (which is the first functional unit 11) has to be connected to a first auxiliary system 51 which is for example a measurement system or position controller, for example by a sensor connection 41 which comprises at least one of an electrical cable, electrical wire, PCB flexure (also known as flex-PCA or flex foil) and/or optical fibre, to deliver the measurement signal to the first auxiliary system 51. The local power supply unit (which is the second functional unit 12) obviously has to receive electrical power from a second auxiliary system 52, e.g. a central power supply system, which supplies electrical power to the various electrical components in the lithographic apparatus. In order to receive this power from the central power supply system, the local power supply unit has to be connected to the central power supply system, e.g. by a power connection 42 which comprises for example at least one of an electric cable, an electrical wire or PCB flexure (also known as flex-PCA or flex foil). Likewise, the cooling device (which is the third functional unit 14) has to be connected to a third auxiliary system 53, which comprises for example a cooling medium source and a pump, in order to allow a cooling medium to circulate through the cooling channel of the cooling device 14. Such cooling connection 43 can for example be a hose.

It is known to combine all these connections 41, 42, 43 in the form of cables, wires, optical fibres, hoses and PCB-flexures (also known as flex-PCA or flex foil) into a flexible utility connection 40, which is for example a bundle of all individual connections of the functional units on the primary frame 10 to their respective associated auxiliary systems 51, 52, 53. The flexible utility connection 40 is generally fixed to the primary frame 10 and to the secondary frame 20.

The flexible utility connection 40 has a dynamic stiffness, which means that its stiffness varies as a function of the frequency of the deformation. It has been observed that the stiffness increases with the frequency. The stiffness may even increase up to or over the level of the stiffness of the primary frame support 30. This may cause problems with the dynamic behaviour of the primary frame 10, as in such cases the stiffness of the flexible utility connection 40 becomes a dominant influence in the dynamic behaviour of the primary frame 10.

Figure 3:
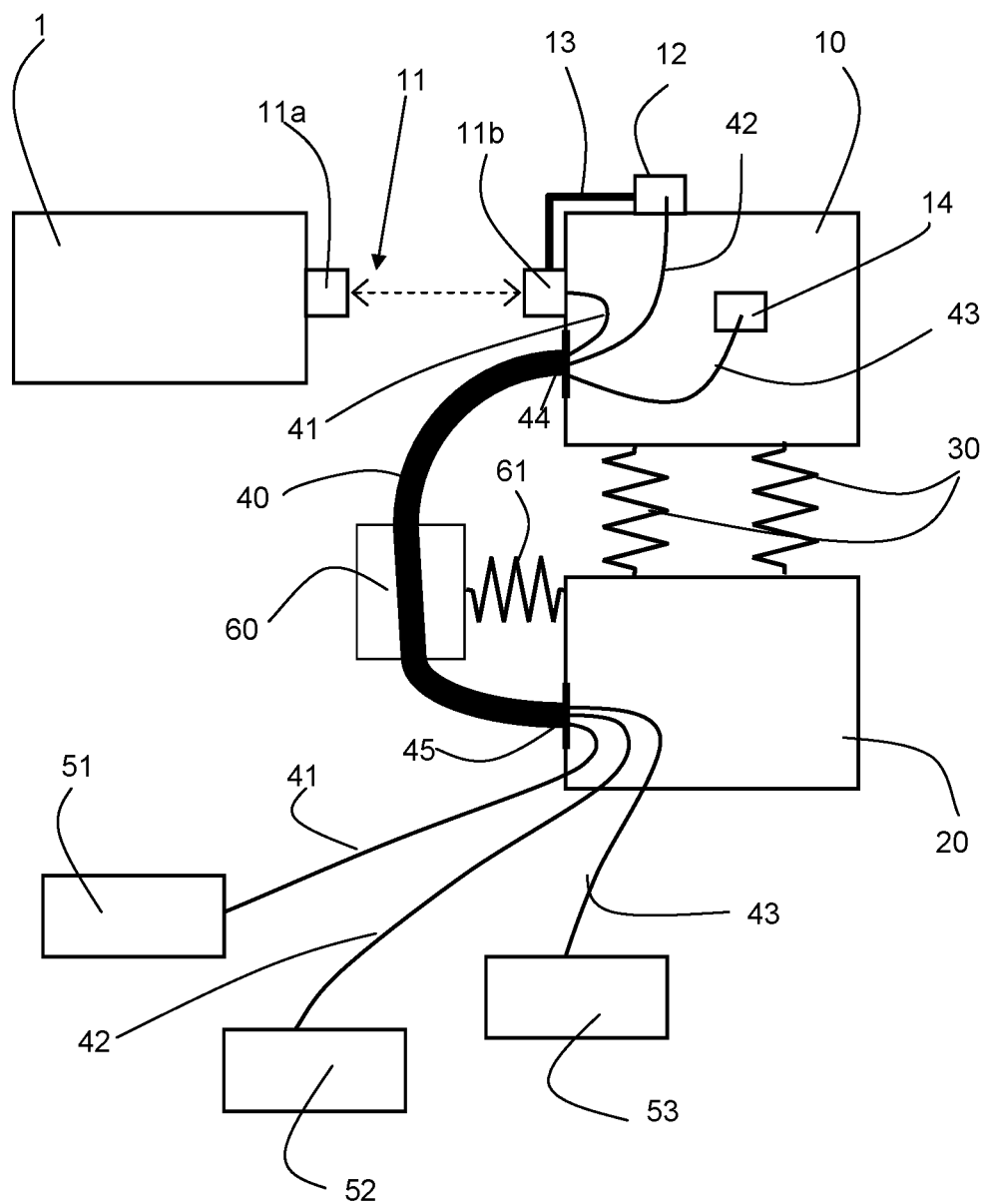

FIG. 3 schematically shows a first possible embodiment of the invention.

The general setup of this embodiment of the invention is similar to the embodiment shown in FIG. 2. In the embodiment of FIG. 3, a primary frame 10 and a secondary frame 20 are provided. Primary frame support 30 supports the primary frame 10 onto the secondary frame 20. In the embodiment of FIG. 3, the primary frame support 30 comprises two vibration isolation systems 31 but alternatively a different number of vibration isolation systems 31 (e.g. three vibration isolation systems 31) is also possible.

In a possible embodiment, the primary frame 10 is a sensor frame and the secondary frame 20 is a force frame. The sensor frame is for example equipped with sensors that determine the position of optical elements of the projection system PS. The force frame for example supports optical elements of the projection system PS. In an alternative embodiment, the primary frame 10 is a force frame and the secondary frame 20 is a base frame. In a further alternative embodiment, the primary frame 10 is a metrology frame and the secondary frame 20 is a base frame. The metrology frame is for example equipped with sensors that determine the position of one or more substrate tables WT. These embodiments may optionally be combined with each other. The sensor frame, force frame, base frame and metrology frame are discussed in more detail in relation to FIG. 4.

In the embodiment of FIG. 3, the primary frame 10 is provided with a plurality of functional units 11, 12, 14. Optionally, a different number of functional units is present In the embodiment of FIG. 3, the first functional unit 11 is a sensor which is configured to measure the position of object 1 relative to the primary frame 10. If the primary frame 10 is a sensor frame, the object 1 is for example an optical element of the projection system PS. If the primary frame 10 is a metrology frame, the object 1 is for example a substrate support, e.g. a substrate table WT or wafer stage. In the embodiment of FIG. 3, the sensor comprises a first sensor element 11a and a second sensor element 11b. The first sensor element 11a is mounted on the object 1 of which the position is to be monitored, and the second sensor element 11b is mounted onto the primary frame. The sensor can for example comprise an interferometric device, an encoder-based device (comprising e.g. a linear encoder) or a capacitive sensor.

The sensor optionally comprises a first sensor element 11a which is or comprises a sensor sender/receiver element and a second sensor element 11b which is or comprises a sensor target element. If the sensor is an encoder based device, the sensor optionally comprises a grating, e.g. a one dimensional or two dimensional grating, which is for example arranged on the object 1 and an encoder head, which comprises a beam source and at least one receiver element which is adapted to receive the beam from the grating, which encoder head is for example arranged on the primary frame 10. Alternatively, the grating may be arranged on the primary frame 10 and the encoder head may be arranged on the object 1.

If the sensor is interferometer based, the sensor comprises a first sensor element 11a which is or comprises a mirror element which is for example arranged on the object 1, and a second sensor element 11b which is or comprises a source for an optical beam and a receiver which is adapted to receive the beam from the mirror element. The source for the optical beam is arranged such that the optical beam strikes the mirror element on the object 1, for example by arranging the second sensor element 11b (which comprises the source and the receiver) onto the primary frame 10 and arranging the first sensor element 11a (which comprises the mirror) onto the object 1. Alternatively, the first sensor element 11a may be arranged on the primary frame 10 and the second sensor element 11b may be arranged on the object 1.

In the embodiment of FIG. 3, the primary frame 10 is further provided with a second functional unit 12. In this case, the second functional unit is a local power supply unit, which for example provides electrical power to the second sensor element 11b via power supply cable 13. For the sake of clarity, the power supply cable 13 is drawn at a distance from the primary frame, but in many cases the power supply cable 13 will be attached to and/or arranged directly onto the surface of the primary frame 10.

In the embodiment of FIG. 3, the primary frame is furthermore provided with a third functional unit 14. In this case, the third functional unit is a cooling device. The cooling device may for example comprise at least one cooling channel which extends through the primary frame 10 through which a cooling medium, e.g. a cooling liquid, can be circulated.

In order to fulfil their function, the functional units 11, 12, 14 have to be connected to respective auxiliary systems 51, 52, 53 which are not arranged on the primary frame 10, but somewhere else in the lithographic system. For example, the sensor (which is the first functional unit 11) has to be connected to a first auxiliary system 51 which is for example a measurement system or position controller, for example by a sensor connection 41 which comprises at least one of an electrical cable, electrical wire, PCB flexure and/or optical fibre, to deliver the measurement signal to the first auxiliary system 51. The local power supply unit (which is the second functional unit 12) obviously has to receive electrical power from a second auxiliary system 52, e.g. a central power supply system, which supplies electrical power to the various electrical components in the lithographic apparatus. In order to receive this power from the central power supply system, the local power supply unit has to be connected to the central power supply system, e.g. by a power connection 42 which comprises for example at least one of an electric cable, an electrical wire or PCB flexure. Likewise, the cooling device (which is the third functional unit 14) has to be connected to a third auxiliary system 53, which comprises for example a cooling medium source and a pump, in order to allow a cooling medium to circulate through the cooling channel of the cooling device 14. Such cooling connection 43 can for example be a hose.

In the embodiment of FIG. 3, all these connections 41, 42, 43, which may be for example electrical cables, electrical wires, optical fibres, hoses and PCB-flexures, are combined into a flexible utility connection 40, which is for example a bundle of all individual connections 41, 42, 43 of the functional units on the primary frame 10 to their respective associated auxiliary systems 51, 52, 53.

Optionally, the flexible utility connection 40 has a primary fixing zone 44 which is fixed to the primary frame 10. The primary fixing zone 44 is arranged between vibration isolation body 60 and the functional unit 11, 12, 14.

Optionally, the flexible utility connection 40 has a secondary fixing zone 45 which is fixed to the secondary frame 20. The secondary fixing zone 45 is arranged between vibration isolation body 60 and the auxiliary system 51, 52, 53.

Optionally, the flexible utility connection 40 is fixed to vibration isolation body 60 at a distance from the primary frame 10 and at a distance from the secondary frame 20.

In the embodiment shown in FIG. 3, the flexible utility connection 40 has a primary fixing zone 44 as well as a secondary fixing zone 45. The primary fixing zone 44 is arranged between vibration isolation body 60 and the functional unit 11, 12, 14, and the secondary fixing zone 45 is arranged between vibration isolation body 60 and the auxiliary system 51, 52, 53. So, the flexible utility connection 40 is fixed to vibration isolation body 60 between the primary fixing zone 44 and the secondary fixing zone 45.

In order to limit the effect of the dynamic stiffness of the flexible utility connection 40 on the dynamic behaviour of the primary frame 10, in accordance with the invention vibration isolation body 60 has been provided. The vibration isolation body 60 has a body mass. The vibration isolation body 60 is moveably connected to the secondary frame 20 by a flexible passive body support 61. The passive body support 61 has a body support stiffness. Optionally, the passive body support 61 is provided with a damper. The flexible utility connection 40 is fixed to the vibration isolation body 60 at a distance from the primary frame 10.

In accordance with the invention, the movements of the vibration isolation body 60 relative to the secondary frame 20 are not actuated or otherwise actively controlled. The passive body support 61 does not contain an actuator for moving the vibration isolation body 60, and also no other actuators configured to move the vibration isolation body are provided. The movements of the vibration isolation body 60 relative to the secondary frame 20 are mainly determined by the stiffness of the passive body support 61.

In a possible embodiment, the passive body support 61 comprises at least one leaf spring. Optionally, the passive body support 61 comprises a first leaf spring and a second leaf spring, wherein the second leaf spring is a leaf spring hinge. Alternatively or in addition, the passive body support 61 comprises a passive damper.

The combination of the vibration isolation body 60 and passive body support 61 together form a mass-spring combination. By fixing the flexible utility connection 40 to the vibration isolation body 60, the dynamic behaviour of the flexible utility connection 40 is influenced. The large increase in stiffness of the flexible utility connection 40 at higher frequencies is reduced or even prevented. Furthermore, the movements of the secondary frame 20 are in this arrangement not directly transferred to the primary frame 10 by the flexible utility connection 40. Instead, the movements of in particular the part of the flexible utility connection 40 between the vibration isolation body 60 and the primary frame 10 are at least partially decoupled from the movements of the secondary frame 20.

Using a passive body support 61 to connect the vibration isolation body 60 to the secondary frame 20 provides a straightforward implementation of the invention in a lithographic apparatus. It provides a simple and effective solution.

In the example of FIG. 3, the passive body support 61 is optionally adapted to allow movement of the vibration isolation body 60 relative to the secondary frame 20 in six degrees of freedom, at least in an isolation frequency range. This can for example be achieved by a passive body support 61 which comprises a first leaf spring and a second leaf spring, wherein the second leaf spring comprises is a leaf spring hinge. Alternatively or in addition, the passive body support 61 comprises a passive damper.

The isolation frequency range extends from a lower frequency limit to an upper frequency limit. Of course, the lower frequency limit is always below the upper frequency limit.

Optionally, the isolation frequency range has an upper frequency limit which is below the first internal resonance frequency of the flexible utility connection 40. This way, the stiffness of the flexible utility connection 40 is far less dependent on the frequency.

Optionally, the lower frequency limit of the isolation frequency range is at least 10 Hz and the upper frequency limit of the isolation frequency range is maximum 100 Hz. These values have shown to be effective in obtaining the desired results.

Optionally, the first resonance frequencies of the six degrees of freedom of the vibration isolation body mounted on the passive body support are within a frequency bandwidth of 20 Hz. This provides more freedom in the design of other components of the lithographic system according to the invention.

In a variant of the invention, which is not shown in the drawings, the flexible passive body support 61 as shown in FIG. 3 is not present. In this variant, the effect of the dynamic stiffness of the flexible utility connection 40 on the dynamic behaviour of the primary frame 10 is still reduced, although it will be harder to obtain the desired resonance frequency in the flexible utility connection with the vibration isolation body attached to it.

In this variant of the invention, the lithographic apparatus comprises:
- a primary frame which is provided with a functional unit,
- a secondary frame,
- a primary frame support, which is adapted to support the primary frame onto the secondary frame,
- a flexible utility connection, adapted to connect the functional unit to an auxiliary system,
- a vibration isolation body having a body mass, wherein the flexible utility connection is fixed to the vibration isolation body at a distance from the primary frame.

Figure 4:
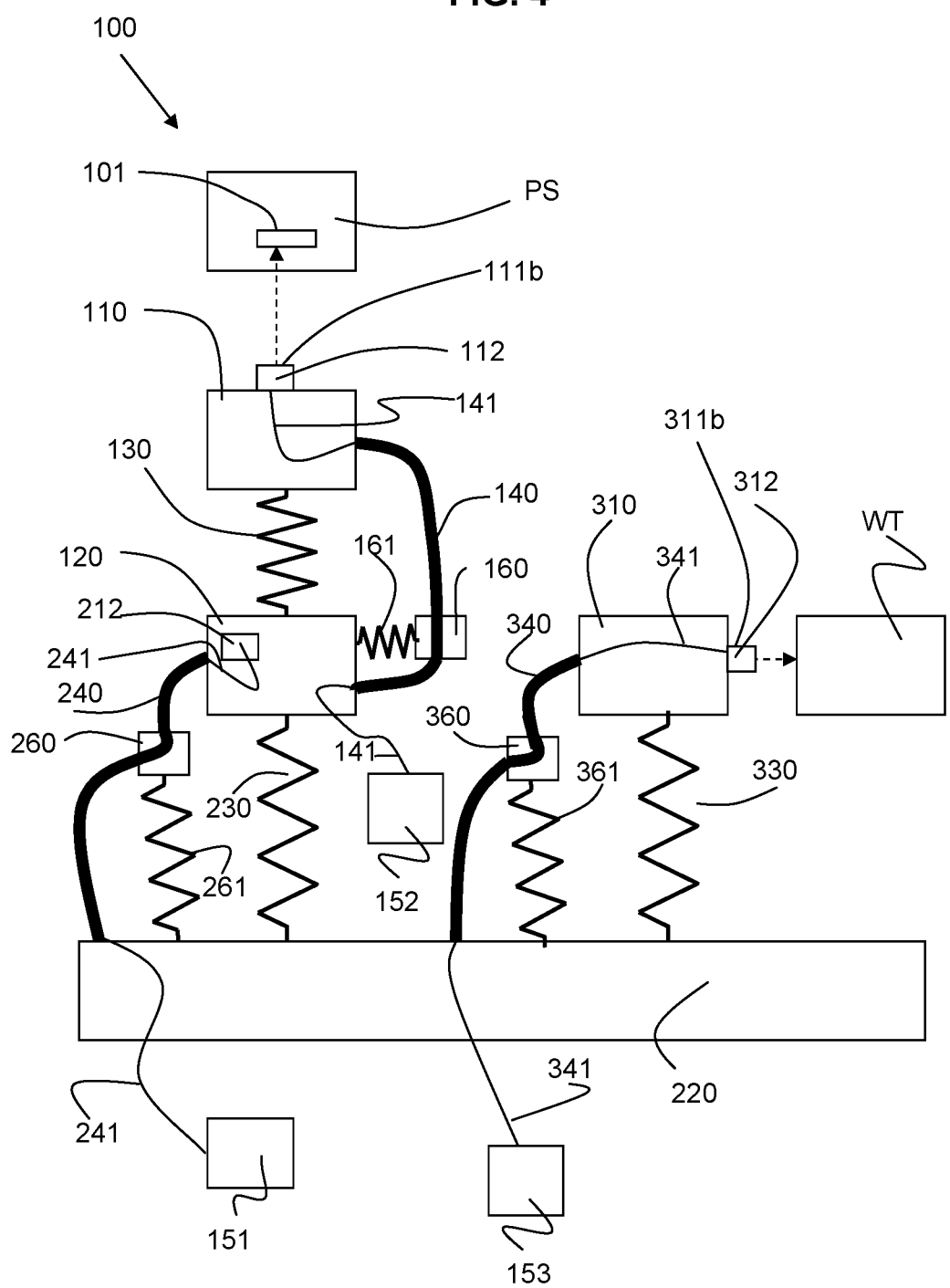

FIG. 4 schematically shows a second possible embodiment of the invention.

In the embodiment of FIG. 4, the lithographic apparatus 100 comprises a projection system PS which is configured to project a patterned radiation beam onto a substrate. The projection system PS comprises a plurality of optical elements. Optical element 101 as shown in FIG. 4 is one of this plurality.

The lithographic apparatus further comprises a sensor frame 110. Onto the sensor frame 110, at least a sensor element 111*b* is mounted of a sensor 112. The sensor 112 forms part of a first position measurement system which is configured to measure a position of at least one of the plurality of optical elements, e.g. of optical element 101, relative to the sensor frame 110.

Movement of the sensor frame 110 relative to the optical element 101 may cause inaccuracies in the measurement of the position of the optical element 101. Therefore, it is aimed to keep the sensor frame 110 as motionless as possible.

In the embodiment of FIG. 4, the sensor frame 110 is the primary frame. The sensor element 111*b* is an example of a functional unit. Alternatively or in addition, other types of functional units, e.g. further sensors (e.g. a thermal sensor or a further position sensor), a power supply, a cooling device may be provided on the sensor frame 110, which are connected to a respective auxiliary system.

In the embodiment of FIG. 4, the lithographic apparatus further comprises a force frame 120. The force frame 120 is configured to support at least one optical element of the projection system PS. In order to keep FIG. 4 clear, this is not shown in FIG. 4. In the embodiment of FIG. 4, the force frame 120 is the secondary frame.

In the embodiment of FIG. 4, furthermore a primary frame support 130 is provided, which is adapted to support the sensor frame 110 (i.e. the primary frame) onto the force frame 120 (i.e. the secondary frame). The primary frame support 130 preferably comprises a vibration isolation system, as this assists in keeping the sensor frame 110 motionless.

The sensor element 111*b* is connected to a first auxiliary system 152, which is for example a central positioning controller, by connection 141. Connection 141 may for example be an electrical cable, an electrical wire, a PCB flexure or an optical fibre. Connection 141 forms part of the flexible utility connection 140 which extends between the sensor frame 110 and the force frame 120. In the embodiment of FIG. 4, the flexible utility connection 140 is fixed to the sensor frame 110 (i.e. the primary frame) and to the force frame 120 (i.e. the secondary frame).

In order to limit the effect of the dynamic stiffness of the flexible utility connection 140 on the dynamic behaviour of the sensor frame 110, in accordance with the invention a vibration isolation body 160 has been provided. The vibration isolation body 160 has a body mass. The vibration isolation body 160 is moveably connected to the force frame 120 by a flexible passive body support 161. The passive body support 161 has a body support stiffness. Optionally, the passive body support 161 is provided with a damper. The flexible utility connection 140 is fixed to the vibration isolation body 160 at a distance from the sensor frame 110. The vibration isolation body 160 and the passive body support 161 in the embodiment of FIG. 4 function in the same way as the vibration isolation body 60 and the passive body support 61 in the embodiment of FIG. 3.

In the embodiment of FIG. 4, a force frame functional unit 212 is provided on the force frame 120. The force frame functional unit 212 is for example a local power supply unit, a sensor (e.g. a position sensor or a thermal sensor) or a cooling device. The force frame functional unit 212 is connected to a further auxiliary system 151 by connection 241. Alternatively, the force frame functional unit 212 may be connected to the same auxiliary system 152 to which the functional unit 112 of the sensor frame 110 is connected to. The connection 241 forms part of a flexible force frame utility connection 240. In the embodiment of FIG. 4, the flexible force frame utility connection 240 is fixed to the force frame 120 and to the base frame 220.

In the embodiment of FIG. 4, furthermore a base frame 220 and a force frame support 230 have been provided. The force frame support 230 is adapted to support the force frame 120 onto the base frame 220. The force frame support 230 preferably comprises a vibration isolation system. This assists in limiting the movements of the force frame 120. When the movements of the force frame 120, e.g. the movements of the force frame 120 relative to the base frame 220, are relatively small, it is easier to the keep the sensor frame 110 motionless.

The embodiment of FIG. 4 further comprises a force frame vibration isolation body 260 having a body mass. The force frame vibration isolation body 260 is moveably connected to the base frame 220 by a flexible passive force frame body support 261. The flexible passive force frame body support 261 has a force frame body support stiffness. Optionally, the flexible passive force frame body support 261 is provided with a damper. The flexible force frame utility connection 240 is fixed to the force frame vibration isolation body 260 at a distance from the force frame 120. The force frame vibration isolation body 260 and the flexible passive force frame body support 261 in the embodiment of FIG. 4 function in the same way as the vibration isolation body 60 and the passive body support 61 in the embodiment of FIG. 3.

Optionally, the connection 141 may be connected to the first auxiliary system 152 or any of the other auxiliary systems via the flexible force frame utility connection 240.

In that case, the connection 141 forms part of the flexible utility connection 140, as well as of the flexible force frame utility connection 240.

The embodiment of FIG. 4 further comprises a substrate support WT. The substrate support WT is adapted to hold the substrate when the patterned radiation beam is projected by the projection system PS onto a substrate. The substrate support WT is movable relative to the base frame 220.

The embodiment of FIG. 4 further comprises a metrology frame 310. Onto the metrology frame 310, at least a sensor element 311b is mounted of a sensor 312. The sensor 312 forms part of a second position measurement system which is configured to measure a position of the substrate support WT relative to the base frame 220.

Movement of the metrology frame 310 relative to the substrate support WT may cause inaccuracies in the measurement of the position of the substrate support WT. Therefore, it is aimed to keep the metrology frame 310 as motionless as possible.

In the embodiment of FIG. 4, the sensor element 311b is an example of a metrology frame functional unit 312 which is provided on the metrology frame 310. Alternatively or in addition, other types of metrology frame functional units, e.g. further sensors (e.g. a thermal sensor or a further position sensor), a power supply, a cooling device may be provided on the sensor frame 110, which are connected to a respective auxiliary system.

The metrology frame functional unit 312 is connected to a further auxiliary system 153 by connection 341. Alternatively, the metrology frame functional unit 312 may be connected to the same auxiliary system 152, 151 to which the functional unit 112 of the sensor frame 110 and/or the force frame functional unit 212, respectively is connected to. The connection 341 forms part of a flexible metrology frame utility connection 340. In the embodiment of FIG. 4, the flexible metrology frame utility connection 340 is fixed to the metrology frame 310 and to the base frame 220.

In the embodiment of FIG. 4, furthermore a metrology frame support 330 has been provided. The metrology frame support 330 is adapted to support the metrology frame 310 onto the base frame 220. The metrology frame support 330 preferably comprises a vibration isolation system. This assists in limiting the movements of the metrology frame 310.

The embodiment of FIG. 4 further comprises a metrology frame vibration isolation body 360 having a body mass. The metrology frame vibration isolation body 360 is moveably connected to the base frame 220 by a flexible passive force metrology body support 361. The flexible passive metrology frame body support 361 has a metrology frame body support stiffness. Optionally, the flexible passive metrology frame body support 361 is provided with a damper. The flexible metrology frame utility connection 340 is fixed to the metrology frame vibration isolation body 360 at a distance from the metrology frame 310. The metrology frame vibration isolation body 360 and the flexible passive metrology frame body support 361 in the embodiment of FIG. 4 function in the same way as the vibration isolation body 60 and the passive body support 61 in the embodiment of FIG. 3.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    a projection system configured to project a patterned radiation beam onto a substrate, the projection system comprising a plurality of optical elements;
    a primary frame, which is provided with a first functional unit,
    a secondary frame, which is provided with a second functional unit;
    a primary frame support, which is adapted to support the primary frame onto the secondary frame;
    a first flexible utility connection, adapted to connect the first functional unit to a first auxiliary system;
    a first vibration isolation body having a first body mass, which is moveably connected to the secondary frame by a first flexible passive body support having a first body support stiffness, wherein the first flexible utility connection is fixed to the first vibration isolation body at a distance from the primary frame;
a tertiary frame connected to the secondary frame through a secondary frame support;
a second flexible utility connection, adapted to connect the second functional unit to a second auxiliary system; and
a second vibration isolation body having a second body mass, which is moveably connected to the tertiary frame by a second flexible passive body support having a second body support stiffness, wherein the second flexible utility connection is fixed to the second vibration isolation body at a distance from the secondary frame.

2. The lithographic apparatus according to claim 1, wherein the first flexible utility connection has a secondary fixing zone, which is fixed to the secondary frame, and wherein the second fixing zone is arranged between the first vibration isolation body and the first auxiliary system.

3. The lithographic apparatus according to claim 1, wherein the first flexible utility connection has a primary fixing zone which is fixed to the primary frame, and wherein the primary fixing zone is arranged between the first vibration isolation body and the first functional unit.

4. The lithographic apparatus according to claim 1, wherein the primary frame support comprises at least one vibration isolation system.

5. The lithographic apparatus according to claim 1, wherein the first flexible passive body support is adapted to allow movement of the first vibration isolation body relative to the secondary frame in six degrees of freedom in an isolation frequency range.

6. The lithographic apparatus according to claim 5, wherein the isolation frequency range has an upper frequency limit which is below a first internal resonance frequency of the first flexible utility connection.

7. The lithographic apparatus according to claim 5, wherein first resonance frequencies of the six degrees of freedom of the first vibration isolation body mounted on the first flexible passive body support are within a frequency bandwidth of 20 Hz.

8. The lithographic apparatus according to claim 5, wherein a lower frequency limit of the isolation frequency range is at least 10 Hz and the upper frequency limit of the isolation frequency range is at most 100 Hz.

9. The lithographic apparatus according to claim 1, wherein the first flexible passive body support comprises at least one leaf spring.

10. The lithographic apparatus according to claim 1, wherein the first flexible utility connection comprises at least one of an electrical cable, an electrical wire, an optical fiber, a hose, or a PCB-flexure.

11. The lithographic apparatus according to claim 1 wherein:
the primary frame is a sensor frame;
the secondary frame is a force frame, which is configured to support at least one optical element of the projection system; and
the tertiary frame is a base frame.

12. The lithographic apparatus according to claim 11 wherein:
the second functional unit is a force frame functional unit, which is provided on the force frame;
the secondary frame support is a force frame support, which is adapted to support the force frame on the base frame;
the second flexible frame utility connection is a flexible force frame utility connection adapted to connect the force frame functional unit to the second auxiliary system; and
the second vibration isolation body is a force frame vibration isolation body having the second body mass, which is moveably connected to the base frame by a flexible passive force frame body support having a force frame body support stiffness,
wherein the flexible force frame utility connection is fixed to the force frame vibration isolation body at a distance from the force frame.

13. The lithographic apparatus according to claim 12, wherein the lithographic apparatus further comprises:
a substrate support, which is adapted to hold the substrate when the patterned radiation beam is projected onto a substrate, the substrate support being movable relative to the base frame;
a metrology frame onto which at least a sensor element is mounted, which forms part of a second position measurement system configured to measure a position of the substrate support relative to the base frame;
a metrology frame functional unit, which is provided on the metrology frame;
a metrology frame support, which is adapted to support the metrology frame onto the base frame;
a flexible metrology frame utility connection, adapted to connect the metrology frame functional unit to a third auxiliary system; and
a metrology frame vibration isolation body having a third body mass, which is moveably connected to the base frame by a flexible passive metrology frame body support having a metrology frame body support stiffness,
wherein the flexible metrology frame utility connection is fixed to the metrology frame vibration isolation body at a distance from the metrology frame.

14. The lithographic apparatus according to claim 13 wherein:
at least two of the first auxiliary system, the second auxiliary system, and the third auxiliary system are a same auxiliary system.

15. The lithographic apparatus according to claim 11 wherein:
the first functional unit is a sensor element, which is provided on the sensor frame;
the primary frame support is a sensor frame support, which is adapted to support the sensor frame on the force frame;
the first flexible frame utility connection is a flexible sensor frame utility connection, adapted to connect the sensor frame functional unit to the first auxiliary system; and
the first vibration isolation body is a sensor frame vibration isolation body having the first second body mass, which is moveably connected to the force frame by a flexible passive sensor frame body support having a sensor frame body support stiffness,
wherein the flexible sensor frame utility connection is fixed to the sensor frame vibration isolation body at a distance from the sensor frame.

16. A device manufacturing method comprising transferring a pattern from a patterning device onto a substrate, comprising the step of using a lithographic apparatus comprising:

a projection system configured to project a patterned radiation beam onto a substrate, the projection system comprising a plurality of optical elements;

a primary frame, which is provided with a first functional unit, a secondary frame, which is provided with a second functional unit;

a primary frame support, which is adapted to support the primary frame onto the secondary frame;

a first flexible utility connection, adapted to connect the first functional unit to a first auxiliary system;

a first vibration isolation body having a first body mass, which is moveably connected to the secondary frame by a first flexible passive body support having a first body support stiffness, wherein the first flexible utility connection is fixed to the first vibration isolation body at a distance from the primary frame;

a tertiary frame connected to the secondary frame through a secondary frame support;

a second flexible utility connection, adapted to connect the second functional unit to a second auxiliary system; and a second vibration isolation body having a second body mass, which is moveably connected to the tertiary frame by a second flexible passive body support having a second body support stiffness, wherein the second flexible utility connection is fixed to the second vibration isolation body at a distance from the secondary frame.

17. A device manufacturing method comprising projecting a patterned radiation beam onto a substrate, comprising the step of using a lithographic apparatus comprising:

a projection system configured to project a patterned radiation beam onto a substrate, the projection system comprising a plurality of optical elements;

a primary frame, which is provided with a first functional unit, a secondary frame, which is provided with a second functional unit;

a primary frame support, which is adapted to support the primary frame onto the secondary frame;

a first flexible utility connection, adapted to connect the first functional unit to a first auxiliary system;

a first vibration isolation body having a first body mass, which is moveably connected to the secondary frame by a first flexible passive body support having a first body support stiffness, wherein the first flexible utility connection is fixed to the first vibration isolation body at a distance from the primary frame;

a tertiary frame connected to the secondary frame through a secondary frame support;

a second flexible utility connection, adapted to connect the second functional unit to a second auxiliary system; and a second vibration isolation body having a second body mass, which is moveably connected to the tertiary frame by a second flexible passive body support having a second body support stiffness, wherein the second flexible utility connection is fixed to the second vibration isolation body at a distance from the secondary frame.

* * * * *